(12) United States Patent
Zimmer et al.

(10) Patent No.: US 8,193,897 B2
(45) Date of Patent: Jun. 5, 2012

(54) INTEGRATED LATERAL SHORT CIRCUIT FOR A BENEFICIAL MODIFICATION OF CURRENT DISTRIBUTION STRUCTURE FOR XMR MAGNETORESISTIVE SENSORS

(75) Inventors: Juergen Zimmer, Ottobrunn (DE); Thomas Bever, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/004,769

(22) Filed: Jan. 11, 2011

(65) Prior Publication Data
US 2011/0163746 A1 Jul. 7, 2011

Related U.S. Application Data

(63) Continuation of application No. 11/941,853, filed on Nov. 16, 2007, now Pat. No. 7,872,564.

(51) Int. Cl.
*H01C 10/00* (2006.01)
(52) U.S. Cl. ............ 338/195; 338/32 R; 338/32 H; 257/421; 257/295; 324/252; 324/207.21; 428/447
(58) Field of Classification Search .......... 338/32 R, 338/32 H; 257/421, 295, 400; 324/252, 324/207.21; 428/692, 447
See application file for complete search history.

(56) References Cited

U.S. PATENT DOCUMENTS

| | | |
|---|---|---|
| 2003/0197503 A1 | 10/2003 | Kawano et al. |
| 2005/0275941 A1 | 12/2005 | Liu et al. |
| 2006/0202291 A1 | 9/2006 | Kolb et al. |

FOREIGN PATENT DOCUMENTS
DE 101 50 233 B4 1/2009

OTHER PUBLICATIONS

Schmeißer, F., et al. "Rotational Speed Sensors KMI 15/16," Philips Semiconductors Application Note AN98087, Jan. 11, 1999, pp. 1-30, Philips Electronics N.V.

*Primary Examiner* — Kyung Lee
(74) *Attorney, Agent, or Firm* — Slater & Matsil, L.L.P.

(57) ABSTRACT

The invention relates to a magnetoresistive device formed to sense an externally applied magnetic field, and a related method. The magnetoresistive device includes a magnetoresistive stripe formed over an underlying, metallic layer that is patterned to produce electrically isolated conductive regions over a substrate, such as a silicon substrate. An insulating layer separates the patterned metallic layer from the magnetoresistive stripe. A plurality of conductive vias is formed to couple the isolated regions of the metallic layer to the magnetoresistive stripe. The conductive vias form local short circuits between the magnetoresistive stripe and the isolated regions of the metallic layer to alter the uniformity of a current flow therein, thereby improving the position and angular sensing accuracy of the magnetoresistive device. In an advantageous embodiment, the metallic layer is formed as electrically conductive stripes oriented at approximately a 45° angle with respect to an axis of the magnetoresistive device.

22 Claims, 8 Drawing Sheets

EXTERNAL MAGNETIC FIELD DIRECTION

INTEGRATED LATERAL SHORT CIRCUIT FOR A BENEFICIAL MODIFICATION OF CURRENT DISTRIBUTION STRUCTURE FOR XMR MAGNETORESISTIVE SENSORS

This application is a continuation of patent application Ser. No. 11/941,853, entitled "Integrated Lateral Short Circuit for a Beneficial Modification of Current Distribution Structure for xMR Magnetoresistive Sensors," filed on Nov. 16, 2007 now U.S. Pat. No. 7,872,564, and is hereby incorporated herein by reference in its entirety.

TECHNICAL FIELD

An embodiment of the invention generally relates to magnetoresistive sensors, a process for producing a resistance dependent on an externally applied magnetic field, and a related method.

BACKGROUND

To sense the position, velocity, or orientation of a physical object, an electrical sensor frequently relies on a change in a magnetic field, which can be sensed by a variety of techniques. One technique utilizes a Hall-effect sensor, which relies on a potential difference created on opposite sides of an electrical conductor. The potential difference is created by an externally applied magnetic field perpendicular to a current flow within the sensor. Another utilizes a loop of wire, relying on Faraday's Law, to create a voltage proportional to a rate of change of a magnetic field enclosed by the area of the loop. A third technique relies on the magnetoresistive effect, which is the property of a material to change its electrical resistance in the presence of an externally applied magnetic field. Although these techniques have been applied in a range of applications, their low sensitivity to an externally applied magnetic field or issues related to low-cost manufacturing have stimulated ongoing research to identify improved field-sensing methods.

Various research efforts have focused on devices exhibiting a magnetoresistive effect. The "anisotropic magnetoresistive effect" (AMR), discovered by William Thomson in 1856, produces a small change in the electrical resistance of certain conductors in the presence of an externally applied magnetic field. Recently discovered variations of this effect produce a greater relative change in electrical resistance. One resistance-altering effect is referred to as the "giant magnetoresistive effect" (GMR), which is a quantum mechanical phenomenon observed in thin films formed of alternating ferromagnetic and nonmagnetic metal layers. Another is the "colossal magnetoresistive effect" (CMR), which is a magnetic property of some materials such as manganese-based perovskite oxides. A third is the "tunnel magnetoresistive effect" (TMR), which occurs when two ferromagnets are separated by a very thin (~1 nm) insulator. Collectively, these magnetoresistive effects can be referred to as xMR.

Magnetoresistance is a general property of a material whereby its electrical resistance is dependent on the angle between the direction of an electrical current flow within the material and the direction of an externally applied magnetic field. The resulting electrical resistance is generally a maximum when the current flow and the externally applied magnetic field are parallel. To produce an electrical resistance with a linear dependence on a change of the direction of the externally applied magnetic field, conductive stripes, typically aluminum or gold, are deposited on the surface of a thin film of an appropriate magnetoresistive material, such as Permalloy, at an angle inclined to a conductive axis of the device by about 45°. Such a structure is often referred to as a "barber pole."

The current distribution within a stripe of an xMR material is roughly uniform over its width, which is usually not the optimal arrangement in certain sensor applications. In order to obtain efficient sensor performance, an xMR stripe is generally formed with a very wide lateral dimension with respect to current flow (e.g., for angle-sensing applications) or with a very narrow lateral dimension (e.g., for rotary speed-sensing applications), which is disadvantageous in view of sensor sensitivity, size, and manufacturing process controllability.

Thus, a challenge in designing a sensor utilizing a stripe of an xMR material to sense a position, velocity, or an angle of a physical object is generating a reliable resistance change in the sensor with sufficient repeatability, magnitude, and accuracy for the application, and with low cost.

SUMMARY OF THE INVENTION

In accordance with one exemplary embodiment of the invention, a magnetoresistive device and a related method are provided. The magnetoresistive device further includes a substrate, a metallic layer formed over the substrate, an insulating layer formed over the metallic structure, a magnetoresistive stripe formed over the insulating layer, and a plurality of conductive vias coupling the metallic layer to the magnetoresistive stripe. In an advantageous embodiment, the magnetoresistive stripe is formed to produce a giant magnetoresistive effect. In a further advantageous embodiment, the magnetoresistive stripe is formed to produce an anisotropic magnetoresistive effect, a colossal magnetoresistive effect, or a tunnel magnetoresistive effect.

BRIEF DESCRIPTION OF THE DRAWINGS

In the figures, identical reference symbols generally designate the same or substantially identical component parts throughout the various views. In the description below, various exemplary embodiments of the invention are described with reference to the following drawings, in which.

DETAILED DESCRIPTION OF ILLUSTRATIVE EMBODIMENTS

Current designs of xMR sensor structures are generally formed with long length-to-width ratio to obtain a CIP (current-in-plane) circuit configuration with sufficiently high electrical resistance so that it can be readily employed for signal processing without the need for a high gain voltage-sensing current. In a typical xMR sensor application, a signal is sensed by applying a known current to an xMR device and sensing the voltage produced across the xMR device with an operational amplifier.

The current distribution over the structural width of an xMR device is generally uniform, i.e., all regions of the structure contribute approximately equally to its magnetoresistance. From a magnetic field sensing point of view, it would be advantageous to underweight and/or to overweight the current density in certain regions of the xMR structure. For example, for angle-sensing applications, edge regions of a stripe-shaped xMR structure exhibit high shape anisotropy, resulting in an angle-sensing error. If current flow in the edge regions was reduced and/or current flow in the middle region of the xMR stripe was increased, the angular field-sensing accuracy would be improved. Of course, a further increase of the structure width would also lead to overweighting of current flow in the central region of the device compared to the edge areas, leading to a reduced angular field-sensing error. The increase in xMR active area is not acceptable for many applications from a cost perspective. For rotational speed-sensing applications, high anisotropy of free layer magnetization is required. Since the minimum width of the xMR structure is limited by the etching process, a shift of the main current to the edge regions would lead to better sensor performance without approaching an etching limit of a manufacturing process.

In an xMR sensor structure, constructed according to the principles of the invention, the current distribution within an xMR sensor is modified by "local short-circuit" (LSC) structures to obtain improved sensor performance. Furthermore, an integration concept is introduced following the principles of the invention that provides LSC structures that are fully compatible with CMOS fabrication, and which do not introduce additional processing steps. The size of the resulting LSC structures advantageously can be very small, and are scalable with the generation of the technology used for xMR sensor production.

Further description of a process for monolithic integration of xMR structures that are fully compatible with current CMOS mass-production processes are provided by Kolb, et al., in U.S. patent application Ser. No. 11/360,538, Publication Number US 2006/0202291 A1, entitled "Magnetoresistive Sensor Module and Method for Manufacturing the Same," which is hereby incorporated herein by reference.

Figure 1:
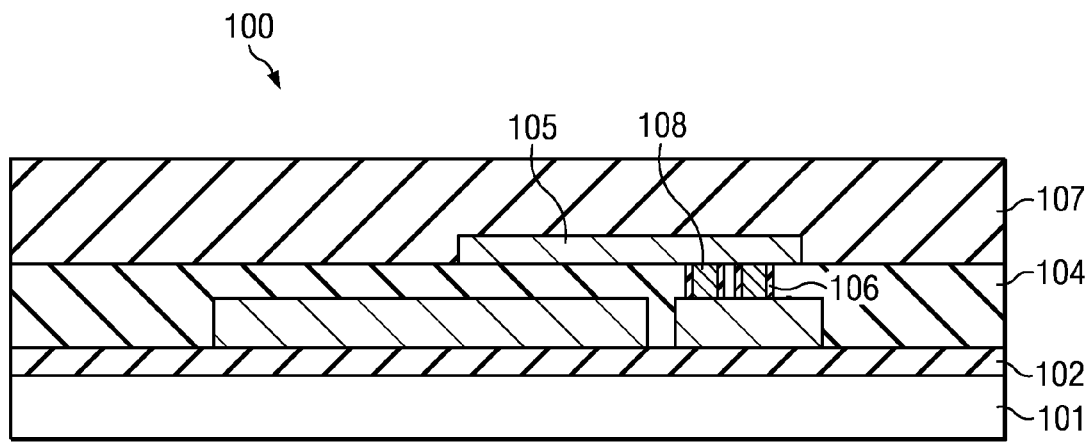
FIG. 1 illustrates a cross-sectional drawing of a magnetoresistive device, constructed according to the principles of the invention.

Turning now to FIG. 1, illustrated is a cross-sectional drawing of an xMR magnetoresistive device 100, constructed according to the principles of the invention. The magnetoresistive device includes conductive vias to an underlying conductive layer to alter a current flow within the magnetoresistive structure to improve its position- or angle-sensing characteristics. The xMR magnetoresistive structure is formed on a substrate 101, which can be, without limitation, a silicon or compound semiconductor substrate such as commonly used to form an integrated circuit, and may include active and/or passive integrated circuit components. Above the substrate an insulating layer 102, such as a silicon dioxide layer, is deposited. A patterned, conductive layer forming interconnect structures, such as conductive structure 103, are formed above insulating layer 102. A further insulating layer 104 is deposited above the patterned, conductive layer. A magnetoresistive device 105, such as a GMR magnetoresistive device, is formed above insulating layer 104. Conductive via structures are formed in insulating layer 104 to provide interconnections between magnetoresistive device 105 and the patterned, conductive layer that was formed therebelow. The conductive via structures comprise a conductive material 108 such as tungsten deposited in apertures of the insulating layer 104. In a preferred embodiment, a conductive film 106 is optionally deposited in the apertures to form a liner prior to filling with the conductive material. A passivating layer 107 for the structure, such as an oxide, nitride, or polyimide layer, is formed above magnetoresistive device 105. Techniques to form and pattern such layers and structures as described hereinabove are well known in the art and will not be described in further detail in the interest of brevity. Thus, as illustrated in FIG. 1, a contact concept is introduced for the realization of local lateral short circuit (LSC) structures to alter a current distribution in a magnetoresistive device.

Figure 2:
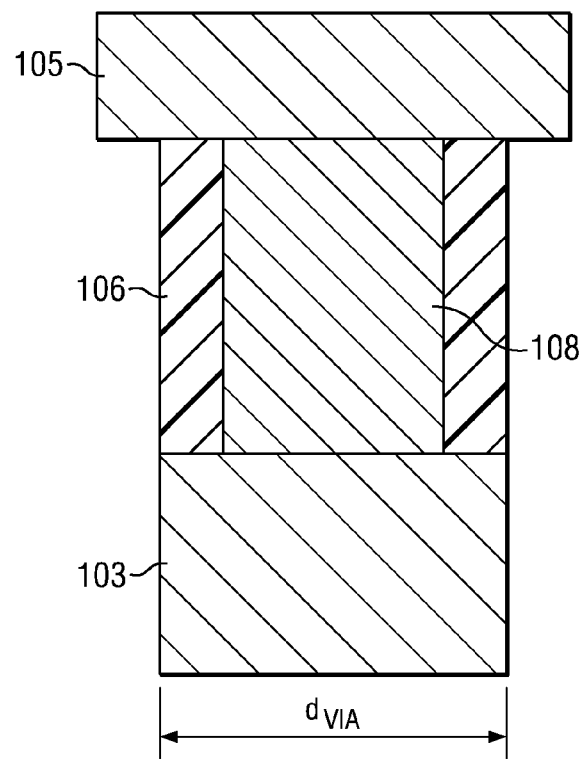
FIG. 2 illustrates a cross-sectional drawing of a magnetoresistive device formed as a magnetoresistive stripe with a via to produce a local lateral short circuit, constructed according to the principles of the invention.

Turning now to FIG. 2, illustrated is a cross-sectional drawing of a portion of a magnetoresistive device formed as a GMR stripe with a via structure of width $d_{VIA}$ beneath a region of the stripe to produce a local lateral short circuit, constructed according to the principles of the invention. The via is formed with a via-filling material (e.g., tungsten, "W") deposited within an optional via film, and a conductive metal structure (e.g., aluminum, "Al") beneath it. The sheet resistance of the xMR layer is thereby significantly reduced in the region around the via for in-plane currents by the high conductivity of the metallic via structures formed thereunder. Elements in FIG. 2, as in other figures, with the same reference designation used in an earlier figure will not be redescribed in the interest of brevity.

In order to evaluate the increase of conductivity in such a region produced by underlying vias coupled to a metal structure, two-dimensional electrical simulations were performed for structures such as illustrated in FIG. 2. The tungsten for the via filling had a thickness of 400 nm, and aluminum in the underlying metal had a thickness of 500 nm, which are typical thickness values for various applications. The conductivity of the tungsten was assumed to be 14 times higher than the GMR conductivity, and the conductivity of the aluminum was assumed to be 30 times higher. Via width, $d_{VIA}$, was assumed to be 0.25 μm. The simulation indicated that most of the current flows through the GMR, through the tungsten-filled vias, and through the underlying aluminum metal. Only a few carriers reach the bottom aluminum layer, since the via width is too small to allow the electrical field to extend substantially over the entire LSC structure. Consequently, the LSC has a four-times higher conductivity than the GMR layer, which is judged to be a moderate increase in conductivity.

A two-dimensional simulation was then performed for the current distribution within the GMR layer with a via width of 5 μm. The tungsten thickness was 400 nm, and the aluminum thickness was 500 nm. It was observed that increasing the width of the via leads to an extension of the electric field substantially throughout the LSC structure, resulting in a significant contribution by the aluminum portion of the structure to its conductivity. In this case, where the width of the via structure $d_{VIA}$ is 5 μm, the conductivity of the LSC region is about 35 times higher than the GMR conductivity, which is judged to be a significant increase.

Figure 3:
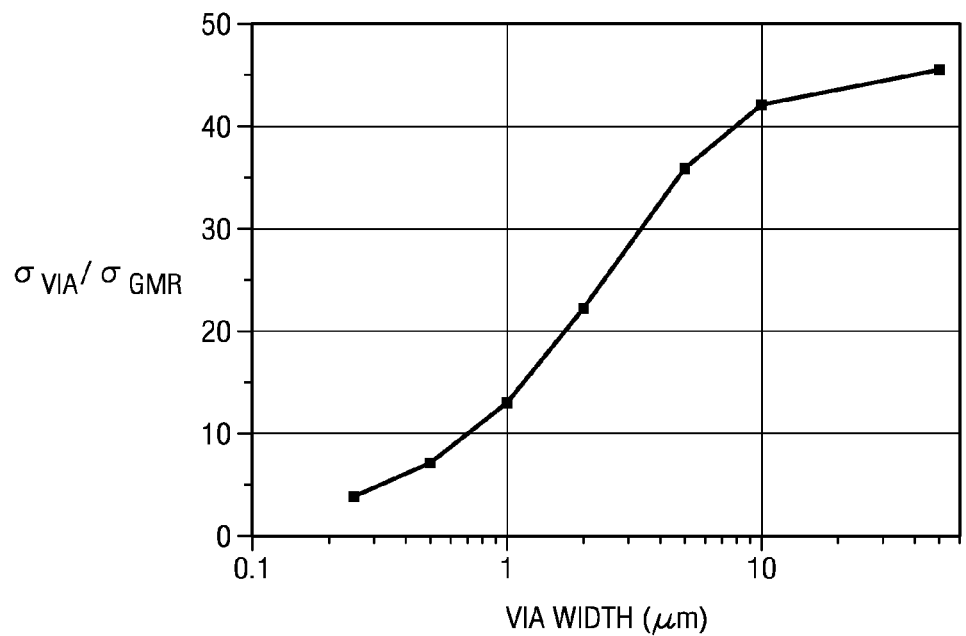
FIG. 3 illustrates a graph showing the ratio of the overall conductivity of a magnetoresistive structure containing local lateral short circuit regions, constructed according to the principles of the invention, to the overall conductivity of a GMR structure without local lateral short circuit regions.

Turning now to FIG. 3, illustrated is the ratio $\sigma_{VIA}/\sigma_{GMR}$ of the overall conductivity, $\sigma_{VIA}$, of a GMR structure containing local lateral short circuit regions to the overall conductivity, $\sigma_{GMR}$, of a GMR layer without local lateral short circuit regions. This ratio is plotted on the vertical axis of the figure against via width with a logarithmic scale on the horizontal axis. The conductivity ratio is a measure of the short circuit efficiency of the LSC structure. FIG. 3 illustrates a correlation between LSC width and the short circuit efficiency of a LSC structure for the case of a 400-nm thick tungsten via and underlying 500 nm thick aluminum metal. For via sizes greater than 0.7 μm, a 10 times higher local conductivity advantageously can be achieved. Using other via filling materials with higher conductivity (e.g., Cu) can further increase the conductivity efficiency of the LSC structure.

The implementation of LSC structures to modify the current distribution in a magnetoresistive structure will be described with several examples.

Figure 4:
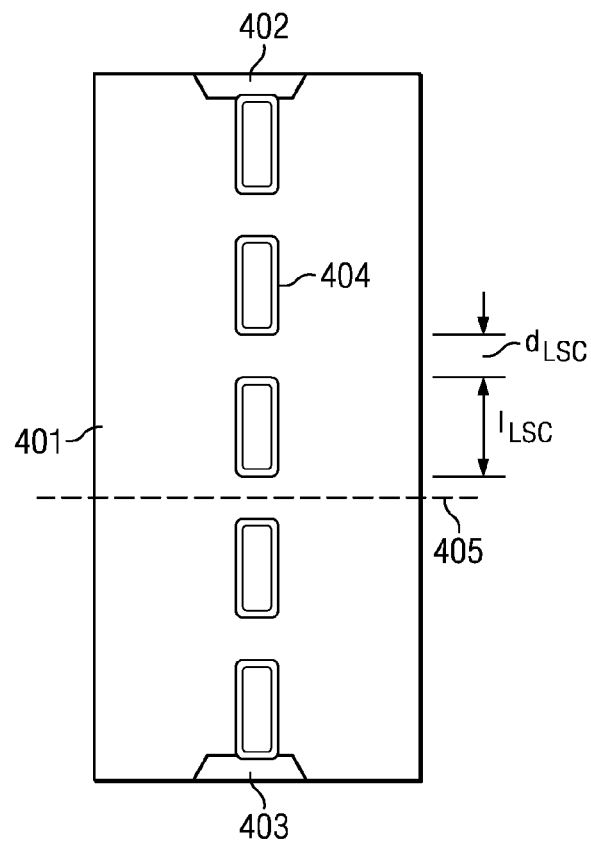
FIG. 4 illustrates a plan-view drawing of a magnetoresistive structure, constructed according to the principles of the invention, for sensing an angular orientation of an externally applied magnetic field.

In a first example, the influence of LSC structures for angle-sensing devices will be described. Turning now to FIG. 4, illustrated is a plan-view drawing of an xMR structure for sensing an angular orientation of an externally applied magnetic field. The xMR sensor stripe 401, without limitation, has a width of 10 μm and a length of 30 μm. The small black regions, 402 and 403, at the top and bottom edges, respectively, of the xMR sensor stripe represent low-resistance contact areas ensuring current injection mainly in the mid region of the stripe. The LSC structures, such as LSC structure 404, are formed in the middle of the sensor stripe, with a length $l_{LSC}$ and a separation distance $d_{LSC}$.

Simulation of the current distribution for the structure illustrated in FIG. 4 demonstrated that substantial nonuniformity of current flow results due to the combination of local current injection in the mid region of the xMR structure and the mid-region implementation of highly conductive LSC structures. Exemplary simulations were performed for the case where $l_{LSC}$=1.1 μm, and $d_{LSC}$=2.2 μm, and LSC conductivity assumed to be 100 times higher than that of the xMR material. The xMR structure width was 10 μm, and its length, 30 μm. As a result of inclusion of local LSC structures, the current density between the LSC structures in the mid-region area is enhanced compared to the current density in the edge regions.

Figure 5:
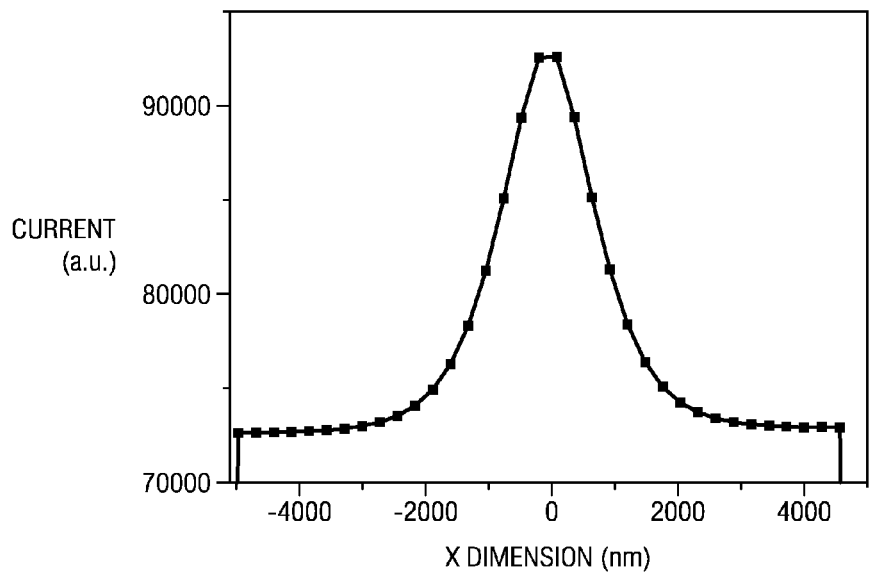
FIG. 5 illustrates the current distribution along a representative line of the device as determined by simulation of the device illustrated in FIG. 4.

FIG. 5 illustrates the current distribution determined by a simulation of the device illustrated in FIG. 4 at the location of the dashed line 405 for the exemplary conditions described in the preceding paragraph. In this simulation example, the current density in the mid-region of the structure is about 27% higher than that at edge regions of the structure. Thus, local LSC structures, constructed according to the principles of the invention, are advantageously employed to enhance the performance of a position-sensing xMR device.

Figure 6:
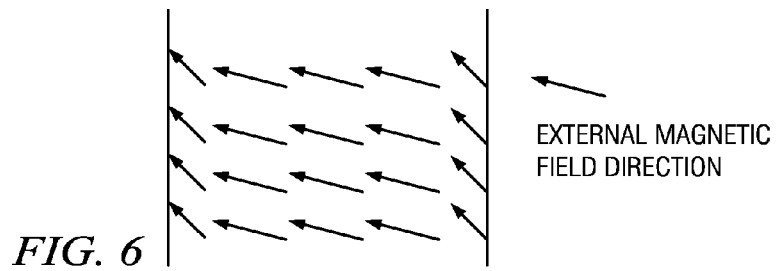
FIG. 6 illustrates a plan-view graphical representation of sensor layer magnetization of a magnetoresistive sensor formed without local short-circuit structures.

Turning now to FIG. 6, illustrated is a plan-view schematic representation of sensor layer magnetization of an xMR sensor according to micromagnetic simulations. It can be seen in FIG. 6 that magnetic domains at the edges of the stripe are not well aligned with the direction of the externally applied magnetic field. The magnetic domains in the mid-region of the structure are better aligned. The reason for the misalignment at the edges is shape anisotropy, which is typically strongest at the edges of a structure. If the current density is uniform over the stripe width, all magnetic domains contribute accurately to the xMR signal. As a result of nonuniformity, the regions at the edge of the structure produce a deviation of the sensed angle of the externally applied magnetic field, i.e., an error, referred to as an "anisotropy angle error," is produced. Furthermore, an additional hysteresis-originated error can also occur. Hysteresis describes the effect of a history-dependent internal magnetization of a ferromagnetic layer upon an external magnetic field, i.e., the internal magnetization depends on the manner in which a certain magnetic field direction is applied. A reduction of the contribution of the edge regions to the xMR signal would therefore reduce the anisotropy- and hysteresis-induced components of the angular error. A shifted current distribution can thus enhance the performance of an angle-sensing xMR device.

Figure 7:
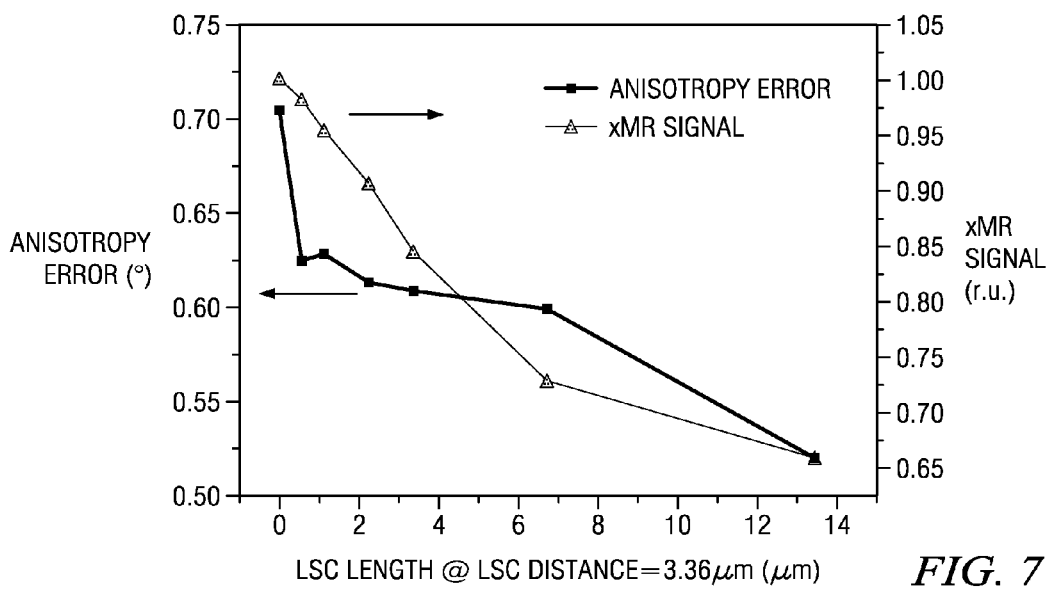
FIG. 7 illustrates a graph showing the simulated behavior of anisotropy error and the associated normalized magnetoresistance.

Turning now to FIG. 7, illustrated is a graph showing the simulated behavior of anisotropy error (on the left vertical axis of the graph) and the associated, normalized xMR resistance ("xMR signal in r.u., relative units" on the right vertical axis of the graph). The graph is constructed as a function of LSC structure length for the exemplary case when the inter-via distance is kept constant at $d_{LSC}$=3.36 μm. The conductivity of the LSC structure as a function of length was chosen according to the numerical findings illustrated in FIG. 4. Without any LSC structures (i.e., $l_{LSC}$=0 μm) and uniform current injection over the whole width of the stripe, a maximum anisotropy error of 0.7° is observed. The inclusion of LSC structures with length increased up to 14 μm leads to a continuous decrease in angular error down to 0.52° for an LSC length of 13.4 μm. Simultaneously, the xMR resistance decreases by about 35% (on a relative basis) since the regions where the LSC structures are located do not contribute to the xMR signal. Portions of the xMR stripe are effectively shorted by the LSC structures. However, in most cases, the gain in sensor performance is more important than the reduction of xMR device resistance. Further stack improvement can be made to compensate for the reduction of xMR device resistance due to the LSC structures. Another possibility to compensate for the loss of xMR device resistance is to lengthen the xMR structure.

Figure 8:
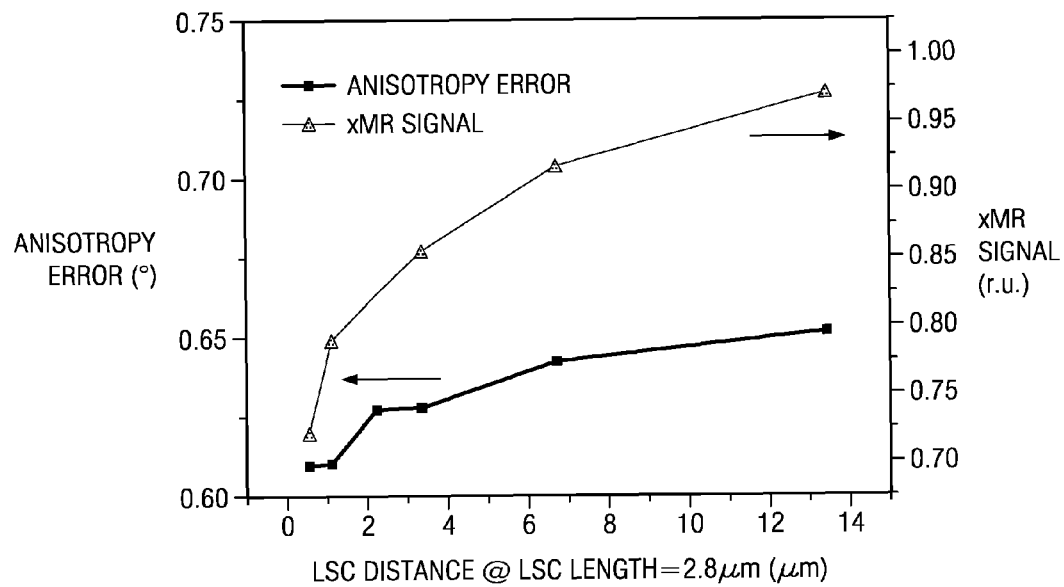
FIG. 8 illustrates a graph showing the simulated behavior of anisotropy error and the associated normalized magneto resistance as a function of local short-circuit structure distance at a fixed local short-circuit structure length.

Turning now to FIG. 8, illustrated is a graph showing the simulated behavior of anisotropy error and the associated, normalized xMR resistance ("signal") as a function of LSC structure distance at a fixed LSC structure length of $d_{LSC}$=2.8

μm. For increased LSC structure distance at a fixed LSC structure length, the anisotropy error is minimum at minimum distance, and increases for larger distances. When the distance between the LSC structures increases, the charge carriers extend to the outer edges of the structure. This results in a growing electrical influence of the edge regions on device resistance. Accordingly, the xMR signal increases.

Besides angular sensors, rotary speed sensors can also derive benefit from a nonuniform current distribution. For rotary speed sensing, high shape anisotropy can be employed to produce a wide linear transition region from a low- to a high-resistance state. Narrowing of the xMR stripe leads to an increase in shape anisotropy, but from a manufacturing point of view, it is more difficult to employ an etch process for small structure sizes with suitably low cost and reproducibility.

Figure 9:
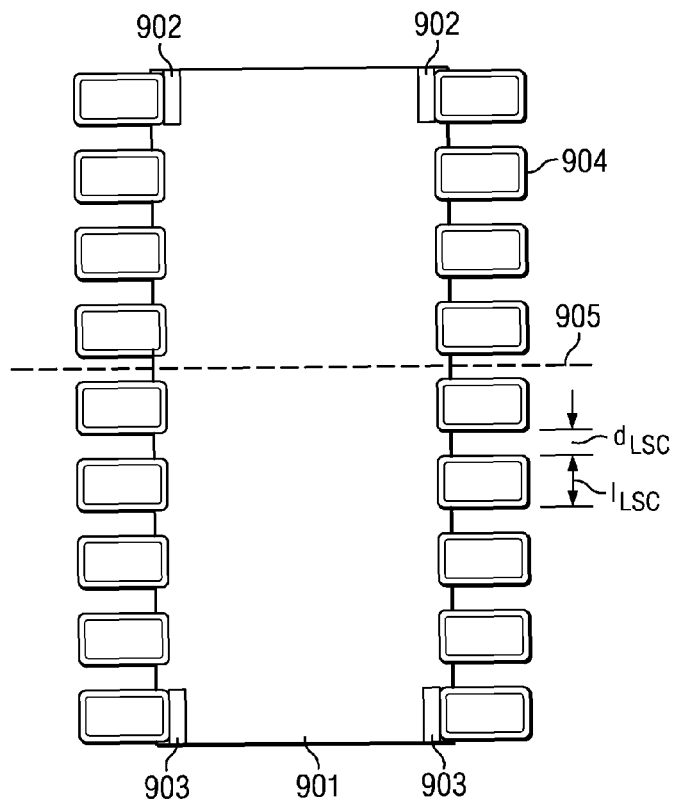
FIG. 9 illustrates a plan-view drawing of a magnetoresistive structure, constructed according to the principles of the invention, that can be advantageously employed for rotary speed sensing.

Turning now to FIG. 9, illustrated is a plan-view drawing of an xMR structure, constructed according to the principles of the invention, that can be advantageously employed for rotary speed sensing. The xMR structure includes xMR stripe 901, low-resistance contact areas 902 and 903, and LSC structure 904. In an exemplary embodiment, the xMR device stripe width is 2 μm, and the length, 30 μm. Implementation of LSC structures along sidewalls of the xMR device provides local current injection to improve field-sensing accuracy.

The implementation of an LSC structure as illustrated in FIG. 9 produces a nonuniform current distribution, with the major portion of the carriers localized at the edges of the device. Simulation was performed of an exemplary xMR structure with $l_{LSC}$=1.1 μm and $d_{LSC}$=1.1 μm, and LSC conductivity assumed to be 100 times higher than that of the xMR material. The xMR structure width was 2 μm, and its length, 30 μm. Examination of current flow at dashed line 905 in FIG. 9 shows current at the edges of the xMR stripe for this example to be approximately 35% higher than that at the mid-region of the stripe. As a consequence, the electrical contribution of the mid-region of the device having a lower shape anisotropy effect to the xMR resistance is reduced, leading to enhancement of the linear transition range in this exemplary structure by about 7%. Concurrently, the xMR resistance is reduced by about 27%.

Figure 10:
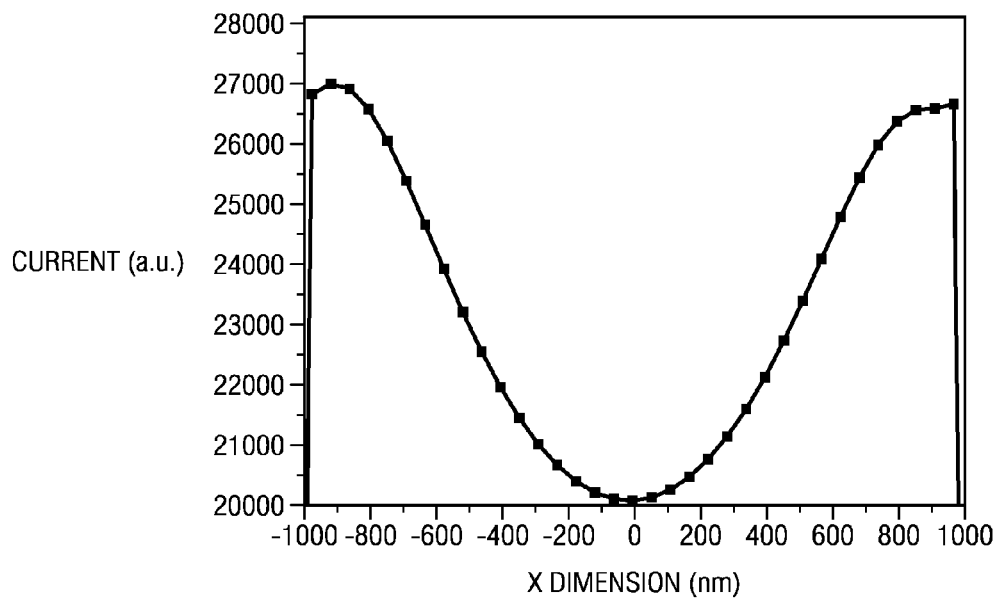
FIG. 10 illustrates the current distribution of the device illustrated in FIG. 9 along a representative line of the device as determined by simulation.

Turning now to FIG. 10, illustrated is the current distribution of FIG. 9 along the dashed line 905. In the edge regions of the stripe, the current is about 35% higher than that in the mid-region of the stripe.

Figure 11A:
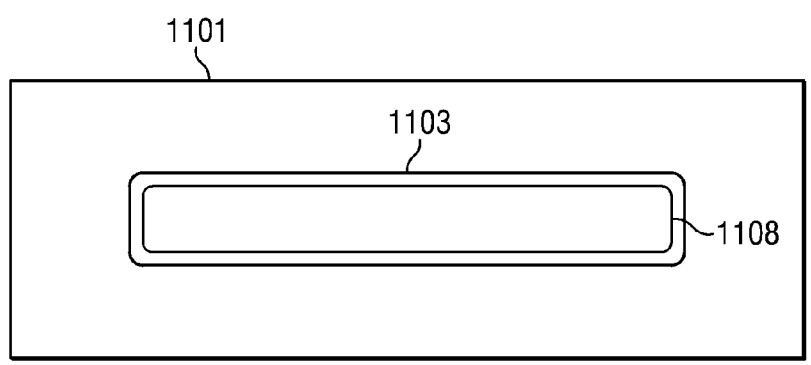
FIGS. 11A-11D illustrate plan-view drawings of exemplary constructions of local short-circuit structures, constructed according to the principles of the invention.
Figure 11B:
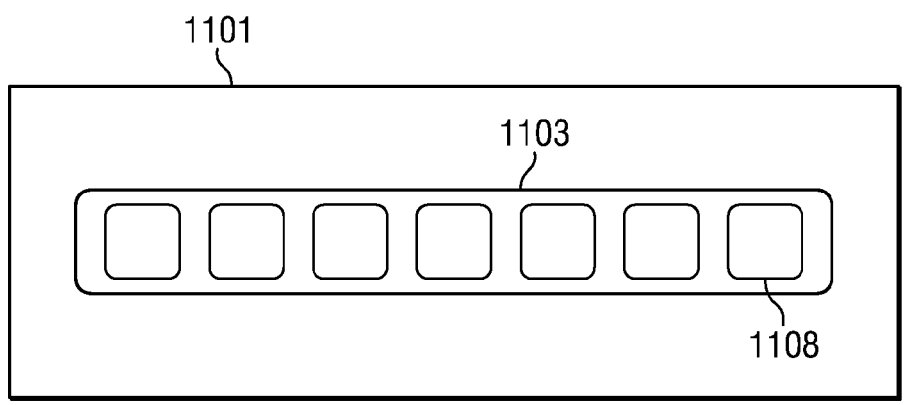
Figure 11C:
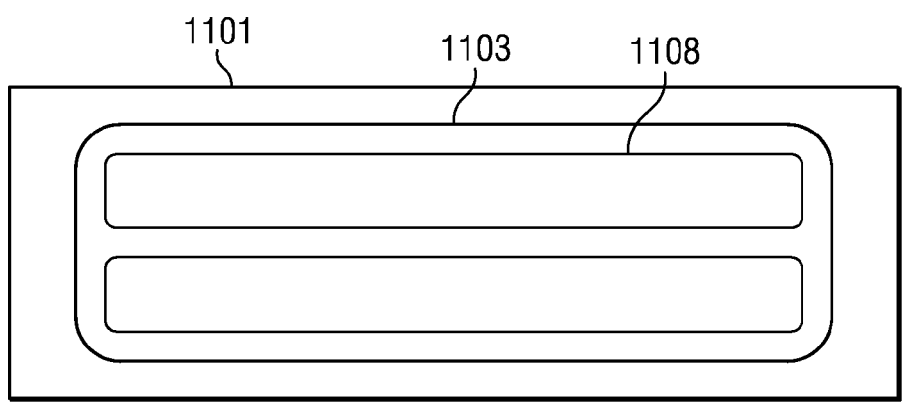
Figure 11D:
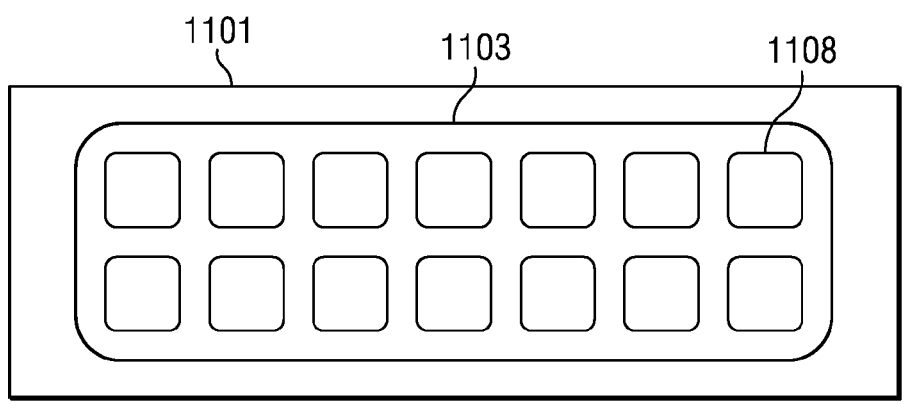

Turning now to FIGS. 11A-11D, illustrated, respectively, are plan-view drawings of exemplary constructions of local short-circuit structures. In FIGS. 11A-11D, 1101 represents a portion of an xMR stripe. A via is represented by reference designation 1108, and an underlying conductive metal structure is represented by reference designation 1103. FIG. 11A illustrates a via with a laterally extended width. FIG. 11B illustrates a plurality of square vias to form a short circuit stripe with narrower via widths. FIG. 11C illustrates a plurality of vias with laterally extended width. And FIG. 11D illustrates a plurality of square vias to form a short circuit stripe with a width that is independent of via size. These examples demonstrate, without limitation, different possible LSC constructions. If the width of a via produces a short circuit which is high enough for the application, then the length of the LSC structure can be determined by a long via, as illustrated in FIG. 11A, or by a plurality of square vias, as illustrated in FIG. 11B. In the event that high short circuit efficiency is required, a plurality of LSC elements connected by an underlying metal layer can be used, as illustrated in FIG. 11B and FIG. 11D. Beyond the linear configurations of LSCs illustrated in these figures, further shapes and orientations are possible within the broad scope of the invention.

A further application of LSC structures, constructed according to the principles of the invention, incorporates so-called "barber-pole" structures, which are well known for anisotropic magnetoresistive (AMR) sensors. The "barber-pole" structures refer to the use of stripes of highly conductive material located with a certain angle with respect to the AMR length axis, and are conventionally deposited on an external surface of an AMR sensor. By including a highly conductive material at an angle with respect to the AMR length axis, the current direction in the region between two barber-pole structures can be determined independently of the direction of an externally applied voltage. The use of barber-pole stripes can be useful for building AMR sensors, since the AMR effect depends on the angle between the current and magnetization direction. For some sensor applications, it is preferable to provide a current direction in the xMR device which is not perpendicular to the gradient of an externally applied electrical potential. In current practice, the barber-pole structures are placed on top of the AMR layer of the structure by additional processing steps which are not fully compatible with current state-of-the-art mass production processes. Barber-pole structures built of LSC structures formed with vias coupled to an underlying metallic layer, constructed according to the principles of the invention, do not have these disadvantages.

Figure 12A:
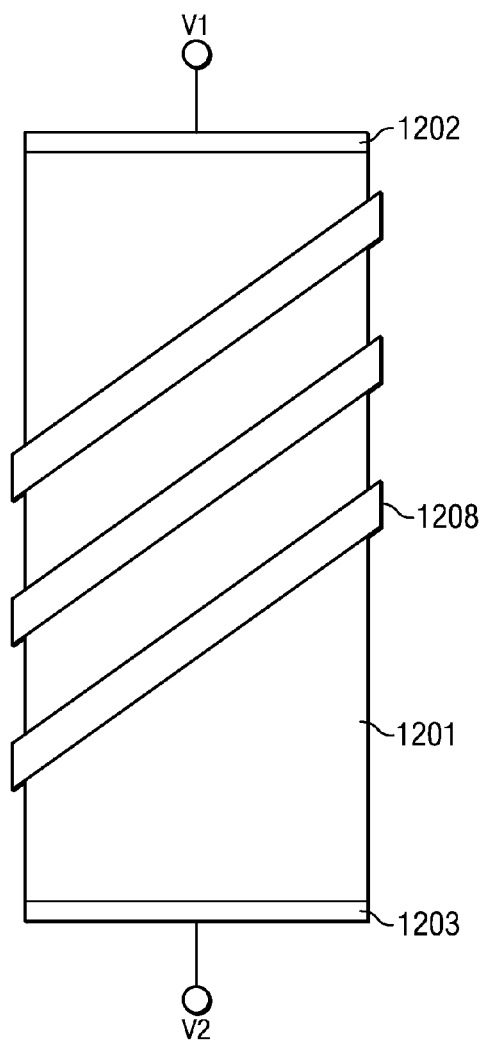
FIG. 12A illustrates a plan-view drawing of an anisotropic magnetoresistive device, constructed according to the principles of the invention, with three barber-pole stripes oriented at an angle of 45° with respect to the device length axis.

Turning now to FIG. 12A, illustrated is a plan-view drawing of an AMR structure, constructed according to the principles of the invention, with three barber-pole stripes oriented at an angle of 45° with respect to the AMR length axis. Of course, a different number of barber-pole stripes can also be used. The AMR structure includes a stripe 1201 of a suitable magnetoresistive material. A magnetic material sometimes employed for construction of an AMR structure is Permalloy. Electrically conductive barber-pole stripes, such as barber-pole stripe 1208, are formed below the surface of the magnetoresistive material at approximately a 45° angle with respect to the length axis of the AMR structure. The embedded conductive barber-pole stripes are coupled to the overlying magnetoresistive material by via structures (not shown), constructed as previously described hereinabove. Top and bottom electrically conductive contacts, 1202 and 1203, respectively, provide contacts for application of a potential difference, V1–V2, so that a current through the structure can be sensed. Alternatively, a known current is supplied through contacts 1202 and 1203, and the resulting potential difference is sensed. The electrical conductivity of the embedded barber-pole material is assumed, without limitation, to be 20 times higher then the AMR conductivity. An exemplary AMR stripe width is 10 μm.

Figure 12B:
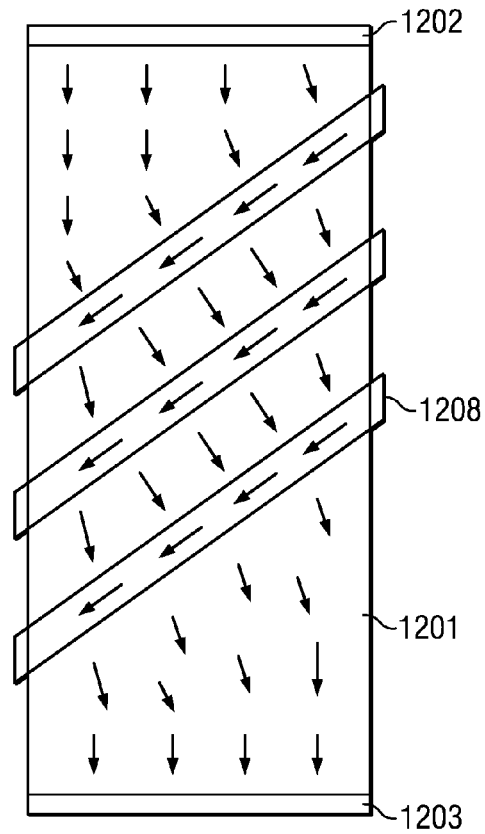
FIG. 12B illustrates a plan-view drawing showing the resulting current direction distribution obtained by a two-dimensional simulation of the device illustrated in FIG. 12A.

Turning now to FIG. 12B, illustrated is a plan-view drawing showing the resulting current direction distribution obtained by a two-dimensional electrical numerical simulation. Without barber-pole stripes, the current direction would be oriented from top to bottom, perpendicular to the potential difference V1–V2. With barber-pole stripes, the direction of internal current flow is realigned to be generally perpendicular to the barber-pole stripe axes. As a result, the barber-pole stripes act as local short-circuit structures, forcing the current to flow between the barber pole stripes at an angle of 45° with respect to the length axis of the AMR structure.

Figure 13A:
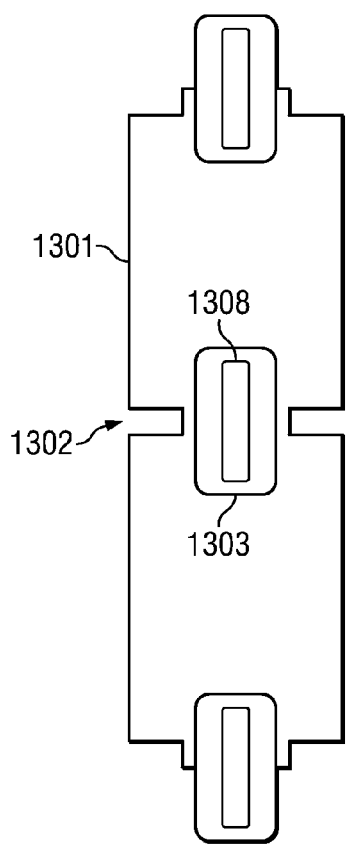
FIG. 13A illustrates a plan-view schematic drawing of an xMR stripe with necking, constructed according to the principles of the invention.

Turning now to FIG. 13A, illustrated is a plan-view schematic drawing of an xMR stripe 1301 with a necking region 1302, resulting in a single, subdivided xMR element connected by xMR material. The xMR stripe 1301 includes vias, such as via 1308, and metal contacts, such as metal contact 1303. Beneath the necking, a local short-circuit structure is placed, which extends into the xMR structure. A non-homogeneous current distribution can be produced by selection of the shape of the xMR structure in combination with the LSC structure configuration. When the distance between LSC structures is smaller than the width of the xMR structure, a non-homogeneous current distribution results throughout the xMR structure. A typical advantageous configuration, without limitation, would be a ratio of the inter-LSC structure distance to xMR structure width that is less than three. The shape of the subdivided xMR elements can be, without limitation, square, rectangular, rhombic, circular, or elliptic.

Figure 13B:
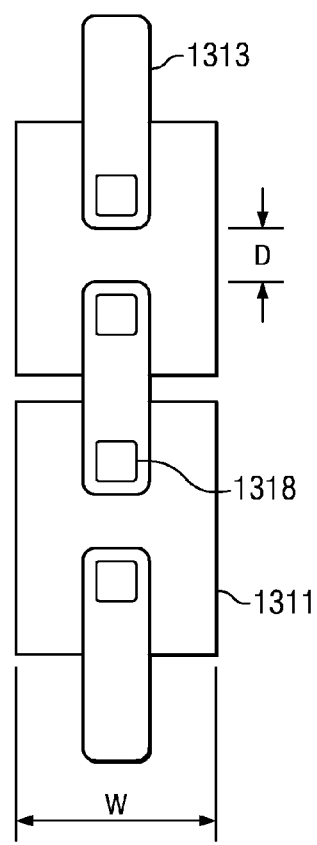
FIG. 13B illustrates a plan-view schematic drawing of serially connected xMR elements with limited contact areas, constructed according to the principles of the invention.

Turning now to FIG. 13B, illustrated is a plan-view schematic drawing of serially connected xMR elements with limited contact areas. Each xMR element, such as xMR element 1311, includes vias, such as via 1318, and metal contacts, such as metal contact 1313. A non-homogeneous current distribution can be produced by selection of the shape of the xMR structure in combination with the contact configuration. When the contact-to-contact distance D is smaller than the width W of the structure, a non-homogeneous current distribution results throughout the structure. A typical xMR element configuration, without limitation, would be a ratio of the contact-to-contact distance to structure width that is less than three. A single sensor element could then be advantageously constructed as a series-connected arrangement of such single xMR elements. The shape of the single xMR elements can be, without limitation, square, rectangular, rhombic, circular, or elliptic.

Figure 14:
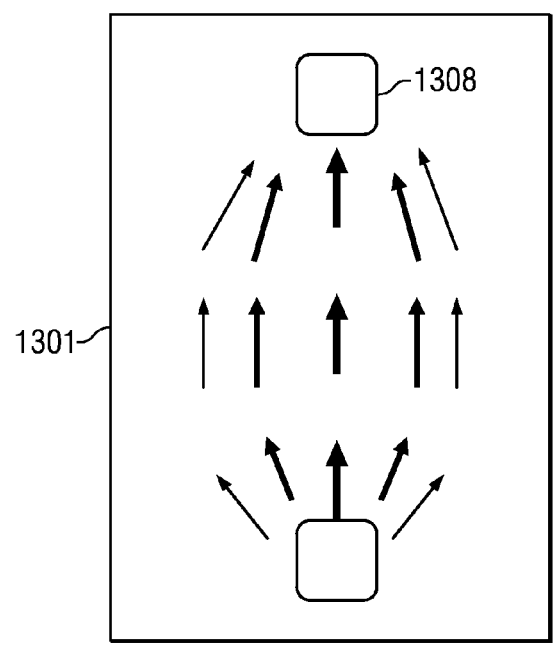
FIG. 14 illustrates schematically a current distribution in an xMR element that is constructed with a small ratio of contact-to-contact distance to structure width.

Turning now to FIG. 14, illustrated is a drawing illustrating schematically a current distribution in an xMR element that is constructed with a small ratio of contact-to-contact distance to structure width. The thickness of the arrows in the drawing is a measure of the current density, indicating the lack of homogeneity of the current flow that can be produced by the shape of the xMR structure in combination with the contact configuration.

A magnetoresistive device has thus been described that may be used to sense an externally applied magnetic field. In accordance with one exemplary embodiment of the invention, the magnetoresistive device includes a magnetoresistive stripe with vias forming local short circuits between the magnetoresistive stripe and an underlying metallic layer. In an advantageous embodiment, an electrically conductive, patterned metallic layer is formed to produce electrically isolated conductive regions over a substrate, and an insulating layer is formed or deposited over the patterned metallic layer. In an advantageous embodiment, the metallic layer comprises aluminum. In an advantageous embodiment, the substrate comprises, without limitation, silicon or a compound semiconductor material such as gallium arsenide. In an advantageous embodiment, the insulating layer comprises, without limitation, silicon dioxide. The magnetoresistive stripe is formed or deposited over the insulating layer, and a plurality of conductive vias couple electrically isolated conductive regions of the metallic layer to the magnetoresistive stripe. In an advantageous embodiment, the magnetoresistive stripe comprises Permalloy. In an advantageous embodiment, the magnetoresistive stripe is formed or configured to produce a giant magnetoresistive effect. In a further embodiment, the magnetoresistive stripe is formed or configured to produce an anisotropic magnetoresistive effect, a colossal magnetoresistive effect, or a tunnel magnetoresistive effect. In a further advantageous embodiment, a plurality of conductive vias forms local short circuits between the magnetoresistive stripe and an electrically isolated region of the metallic layer. In an advantageous embodiment, the vias comprise tungsten, but other electrically conductive materials can be used. In a further advantageous embodiment, electrically conductive contacts are formed or deposited at opposing ends of the magnetoresistive stripe to enable an electrical potential difference to be applied to the magnetoresistive stripe. In a further advantageous embodiment, the metallic layer is formed as electrically conductive stripes oriented at approximately a 45° angle with respect to an axis of the magnetoresistive stripe. Of course, other angles of orientation of stripes formed in the metallic layer may be employed for a particular application.

Another exemplary embodiment of the invention provides a method of forming a magnetoresistive device that may be used to sense an externally applied magnetic field. In the method, the magnetoresistive device is formed with vias to produce local short circuits between a magnetoresistive stripe and an underlying metallic layer. In accordance with one exemplary embodiment, the method includes forming an electrically conductive, patterned metallic layer over a substrate to produce electrically isolated conductive regions, and forming an insulating layer over the patterned metallic layer. In an advantageous embodiment of the method, the metallic layer comprises aluminum. In an advantageous embodiment of the method, the substrate comprises silicon or a compound semiconductor material such as gallium arsenide. In an advantageous embodiment of the method, the insulating layer comprises silicon dioxide. In an advantageous embodiment, the method includes forming the magnetoresistive stripe over the insulating layer, and coupling the plurality of electrically isolated conductive regions of the metallic layer to the magnetoresistive stripe with conductive vias formed between the metallic layer and the magnetoresistive stripe. In an advantageous embodiment of the method, the magnetoresistive stripe comprises Permalloy. In an advantageous embodiment, the method includes forming the magnetoresistive stripe to produce a giant magnetoresistive effect. In a further embodiment, the method includes forming the magnetoresistive stripe to produce an anisotropic magnetoresistive effect, a colossal magnetoresistive effect, or a tunnel magnetoresistive effect. In a further advantageous embodiment, the method includes forming a local short circuit between the magnetoresistive stripe and an electrically isolated region of the metallic layer by forming a plurality of conductive vias in the insulating layer between the magnetoresistive stripe and the electrically isolated region of the underlying metallic layer. In an advantageous embodiment of the method, the vias comprise tungsten, but other electrically conductive materials can also be used. In a further advantageous embodiment, the method includes forming electrically conductive contacts at opposing ends of the magnetoresistive stripe to enable an electrical potential difference to be applied to the magnetoresistive stripe. In a further advantageous embodiment, the method includes forming the metallic layer as electrically conductive stripes oriented at approximately a 45° angle with respect to an axis of the magnetoresistive stripe. Of course, other angles of orientation of stripes formed in the metallic layer may be employed for a particular application.

Another exemplary embodiment of the invention provides a magnetoresistive device formed on a metallic layer. A magnetoresistive stripe comprising xMR elements connected by small necking regions are deposited on an insulating layer deposited on the metallic layer, and a plurality of conductive vias are formed in the insulating layer to couple the electrically isolated and electrically conductive contacts formed in the metallic layer to the magnetoresistive stripe around the necking region. A ratio of a diameter of the xMR element to a separation distance between the vias is less than three to produce a substantially inhomogeneous current flow within the magnetoresistive stripe. In a further advantageous embodiment, a necking region is formed in the magnetoresistive stripe, wherein a local short circuit is formed extending into the magnetoresistive stripe.

Another exemplary embodiment of the invention provides a magnetoresistive device formed on a substrate. A metallic layer is deposited on the substrate to form electrically isolated and electrically conductive contacts, and an insulating layer is deposited on the metallic layer. A magnetoresistive stripe is deposited on the insulating layer, and a plurality of conductive vias are formed in the insulating layer to couple the electrically isolated and electrically conductive contacts formed in the metallic layer to the magnetoresistive stripe. A ratio of a diameter of the single xMR element to a separation distance between the vias is less than three to produce a substantially inhomogeneous current flow within the magnetoresistive stripe.

Although a magnetoresistive device has been described for application to sensing an externally applied magnetic field to sense a location, speed, or an orientation of an object, it should be understood that other applications of magnetoresistive devices are contemplated within the broad scope of the invention, and need not be limited to sensing a location, speed, or an orientation of an object.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A magnetoresistive sensor device comprising:
   a magnetoresistive structure;
   a first via electrically connected to the magnetoresistive structure;
   a second via electrically connected to the magnetoresistive structure; and
   a conductive structure electrically connected to the first via and to the second via to generate a local short-circuit along a length of the magnetoresistive structure.

2. The magnetoresistive sensor device according to claim 1, wherein the conductive structure is a conductive region of a metal layer, the conductive region being electrically isolated from at least one other region of the metal layer.

3. The magnetoresistive sensor device according to claim 1, wherein the first via and the second via are close to each other.

4. The magnetoresistive sensor device according to claim 1, wherein the magnetoresistive structure comprises a magnetoresistive stripe disposed over an insulating region.

5. The magnetoresistive sensor device according to claim 4, wherein magnetoresistive stripe comprises Permalloy.

6. A magnetoresistive sensor comprising:
   a magnetoresistive layer; and
   an interconnect structure contacting the magnetoresistive layer at a first contact region and a second contact region to provide a local short-circuit current from the first contact region via the interconnect structure to the second contact region along a length of the magnetoresistive layer.

7. The magnetoresistive sensor according to claim 6, wherein the interconnect structure comprises a first via and a second via.

8. The magnetoresistive sensor according to claim 6, wherein the interconnect structure comprises a conductive structure, the conductive structure comprising a first metal layer region, the first metal layer region being electrically isolated from a second metal layer region.

9. The magnetoresistive sensor according to claim 8, further comprising an insulating region electrically isolating the first metal layer region of the metal layer from the second metal layer region.

10. The magnetoresistive sensor according to claim 6, wherein interconnect structure comprises conductive stripes formed at approximately a 45° angle with respect to an axis of said magnetoresistive layer.

11. A method for manufacturing a magnetoresistive sensor device comprising:
    forming a magnetoresistive structure;
    forming a first via and a second via, the first via and the second via being electrically connected to the magnetoresistive structure; and
    forming a first conductive structure electrically connected to the first via and the second via to generate a local short-circuit structure along a length of the magnetoresistive structure.

12. The method of claim 11, further comprising forming an insulating region, wherein forming the magnetoresistive structure comprises forming the magnetoresistive structure over the insulating region.

13. The method of claim 12, wherein:
    forming the magnetoresistive structure comprises forming the magnetoresistive structure from Permalloy;
    forming the insulating region comprises forming the insulating region from silicon dioxide;
    forming the first via and the second via comprises forming the first via and the second via from tungsten; and
    forming the first conductive structure comprises forming the first conductive structure from aluminium.

14. The method of claim 12, wherein forming the magnetoresistive structure comprises forming a magnetoresistive stripe over the insulating region.

15. The method of claim 14, wherein forming the first conductive structure comprises forming conductive stripes at approximately a 45° angle with respect to an axis of the magnetoresistive stripe.

16. The method of claim 11, further comprising forming a second conductive structure electrically isolated from the first conductive structure.

17. A method of sensing a magnetic field, the method comprising:
    detecting a current flowing through a magnetoresistive structure that is locally short circuited by a local interconnect structure contacting the magnetoresistive structure at first and second contact regions along a length of the magnetoresistive structure; and
    providing a sensor signal based on the detected current flowing through the magnetoresistive structure.

18. The method of claim 17, further comprising determining a position, velocity, or orientation of a physical object based on the sensor signal.

19. The method of claim 17, wherein detecting the current flowing through the magnetoresistive structure further comprises detecting a current flowing through a magnetoresistive stripe.

20. The method of claim 19, further comprising producing a giant magnetoresistive effect through the magnetoresistive stripe.

21. A magnetoresistive sensor comprising:
    a magnetoresistive layer; and
    an interconnect structure contacting the magnetoresistive layer at a first contact region and a second contact region to provide a local short-circuit current from the first contact region via the interconnect structure to the second contact region, wherein interconnect structure comprises conductive stripes formed at approximately a 45° angle with respect, to an axis of said magnetoresistive layer.

22. A method for manufacturing a magnetoresistive sensor device comprising:

forming an insulating region;

forming a magnetoresistive stripe over the insulating region;

forming a first via and a second via, the first via and the second via being electrically connected to the magnetoresistive stripe; and forming a first conductive structure electrically connected to the first via and the second via to generate a local short-circuit structure, wherein forming the first conductive structure comprises forming conductive stripes at approximately a 45° angle with respect to an axis of the magnetoresistive stripe.

* * * * *